United States Patent
Gregor et al.

(10) Patent No.: US 11,971,818 B1
(45) Date of Patent: Apr. 30, 2024

(54) MEMORY VIEW FOR NON-VOLATILE MEMORY MODULE

(71) Applicant: Cadence Design Systems, Inc., San Jose, CA (US)

(72) Inventors: Steven L. Gregor, Owego, NY (US); Puneet Arora, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 6 days.

(21) Appl. No.: 17/863,985

(22) Filed: Jul. 13, 2022

(51) Int. Cl.
  *G06F 12/08* (2016.01)
  *G11C 29/44* (2006.01)
  *G11C 29/48* (2006.01)

(52) U.S. Cl.
  CPC .............. *G06F 12/08* (2013.01); *G11C 29/44* (2013.01); *G06F 2212/202* (2013.01); *G11C 29/48* (2013.01)

(58) Field of Classification Search
  CPC ......... G11C 29/42; G11C 29/44; G11C 29/48; G06F 12/08; G06F 12/0888; G06F 12/0804; G06F 12/0828; G06F 12/0835
  See application file for complete search history.

(56) References Cited

U.S. PATENT DOCUMENTS

| | | | |
|---|---|---|---|
| 6,549,476 B2 | 4/2003 | Pinney | |
| 7,371,627 B1 | 5/2008 | Forbes | |
| 8,341,733 B2 | 12/2012 | Craft | |
| 8,637,362 B2 | 1/2014 | Forbes | |
| 9,921,969 B2* | 3/2018 | Gunnam | G06F 12/1072 |
| 10,447,728 B1 | 10/2019 | Steinberg | |
| 10,521,532 B1 | 12/2019 | Satasia | |
| 2016/0048464 A1 | 2/2016 | Nakajima | |
| 2016/0179665 A1 | 6/2016 | LeMay | |
| 2016/0210220 A1 | 7/2016 | Filachek | |
| 2016/0210221 A1 | 7/2016 | Filachek | |
| 2017/0300415 A1* | 10/2017 | Bonen | G06F 13/1678 |

* cited by examiner

*Primary Examiner* — Shelly A Chase
(74) *Attorney, Agent, or Firm* — Foley & Lardner LLP

(57) ABSTRACT

A memory view generator evaluates a Liberty file characterizing an NVM module to generate a memory view file for the NVM module. The memory view file includes a port alias identifying ports of the NVM module. The port alias for a set of ports of the NVM module characterizes a type of port in the set of ports. The memory view file includes a port action identifying ports of the NVM module that have a static value and a port access identifying ports of the NVM module that have a dynamic value. The memory view file has an address limit characterizing a number of words in the NVM module and an address partition characterizing address bits and data bits. The memory view file includes a read delay that defines a number of clock cycles needed to hold an address bus stable after a strobe port transitions to an inactive state.

20 Claims, 14 Drawing Sheets

```
                            ┌─ 200
                  236 ─┐
         ┌──────────────────┐
   232 ──┤ pin STROBE {
         │  ...
       ┌─/* trd */─────────────────────────────┐
       │  min_pulse_width () {                 │
   204─┤   260─ when : "!CSB*PGENB*LOAD*!PS*!PD" ; │
       │        sdf_cond : "check_read_start" ; ─216
       │   212─ constraint_high : 120.00134 ;   │
       │  }                                    │
       │                       268         224 │
       └───────────────────────────────────────┘
       ┌─/* tpgm_min */────────────────────────┐
       │  min_pulse_width () {                 │
   208─┤   260─ when : "!CSB*!PGENB*LOAD*PS*!PD" ; │
       │        sdf_cond : "check_pgm_start" ;  │
       │   212─ constraint_high : 1100.00512 ; ─220
       │  }                                    │
       │                       268         228 │
       └───────────────────────────────────────┘

┌─ 250                                    ┌─ 270
        port_alias                              port_access
        {                                       {
                      236─┐                        ...
   254 ──┤ enable  STROBE                          PS 0
                                                   PGENB 1
          ...                                      PD 1
        }                                          LOAD 1
                                                   CSB 1
                                                   ...
                                                }

FIG. 2
```

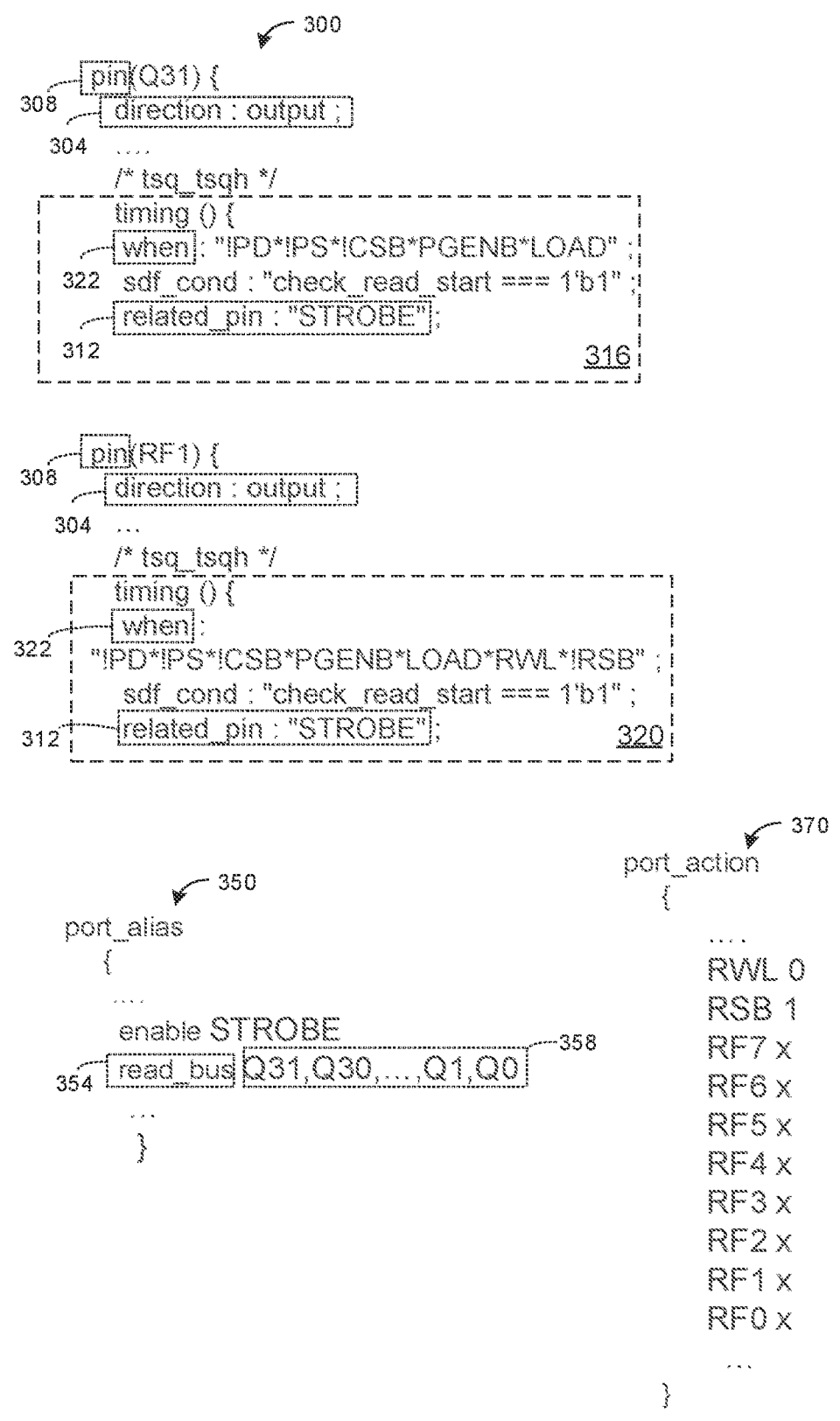

```
                          300
                         ↙
   308 ┌─pin(Q31) {
       └─ direction : output ;
   304    ...
          /* tsq_tsqh */
         ┌─────────────────────────────────────┐
         │ timing () {                         │
         │  when : "IPD*IPS*ICSB*PGENB*LOAD" ; │
   322   │  sdf_cond : "check_read_start === 1'b1" ; │
         │  related_pin : "STROBE" ;           │
   312   │                                 316 │
         └─────────────────────────────────────┘

308 ┌─pin(RF1) {
       └─ direction : output ;
   304    ...
          /* tsq_tsqh */
         ┌─────────────────────────────────────┐
         │ timing () {                         │
         │  when :                             │
   322   │ "IPD*IPS*ICSB*PGENB*LOAD*RWL*IRSB" ;│
         │  sdf_cond : "check_read_start === 1'b1" ; │
   312   │  related_pin : "STROBE" ;       320 │
         └─────────────────────────────────────┘
```

```
                                          370
                                         ↙
                                     port_action
                 350                 {
                ↙                     ....
          port_alias                  RWL 0
          {                           RSB 1
           ....                       RF7 x
           enable STROBE              RF6 x
           ┌──────────────────┐ 358   RF5 x
       354 │read_bus│Q31,Q30,...,Q1,Q0│ RF4 x
           └──────────────────┘       RF3 x
           ...                        RF2 x
          }                           RF1 x
                                      RF0 x
                                      ...
                                     }
```

FIG. 3

```
                    ┌─ 400
   ┌──────┐
   │pin(A12) {
408 │ ┌─────────────────┐
   └─│direction : input│;
404   └─────────────────┘
    ┌─────────────────────────────────────┐
    │ timing () {                         │
    │   sdf_cond : "check_pgm_start" ;    │
    │                                  420│
    └─────────────────────────────────────┘

┌──────┐
   │pin(A7) {
408 │ ┌─────────────────┐
   └─│direction : input│;
404   └─────────────────┘
    ┌─────────────────────────────────────┐
    │ ...                                 │
    │ timing () {                         │
    │   sdf_cond : "check_pgm_start" ;416 │
    │                                     │
    │ ...                                 │
    │ timing () {                         │
    │   sdf_cond : "check_read_start" ;   │
    │   ...                            412│
    └─────────────────────────────────────┘
```

```
                                              ┌─ 470
                                            port_action
                                            {
                ┌─ 450                       ....
            port_alias                       RWL 0
            {                                RSB 1
              ....                           RF7 x
              enable STROBE                  RF6 x
              q Q31,Q30,...,Q1,Q0            RF5 x
         ┌───┬────────────────────┐          RF4 x
       462│dba│A12,A11,A10,A9,A8  │466       RF3 x
         ┌───┬────────────────────────┐      RF2 x
       454│a  │A7,A6,A5,A4,A3,A2,A1,A0│458   RF1 x
         └───┴────────────────────────┘      RF0 x
              ...                          ┌─────┐
            }                           474│MR x │
                                           └─────┘
                                             ...
                                            }
```

FIG. 4

```
            ┌─ 500
            ▼
    address_partition
    {
        row 7:0
    }
```

FIG. 5

```
pin(CSB) {
  timing () {
    sdf_cond : "check_read_start" ;           ~616
    related_pin : "STROBE" ;
    timing_type : non_seq_hold_falling ;      ~628
    rise_constraint (constraint_table_template) {
      values("4.070,4.058,4.023,4.045,4.036", \
                                                604
```

```
pin(CSB) {
  timing () {
    sdf_cond : "check_read_start" ;           ~620
    related_pin : "STROBE" ;
    timing_type : non_seq_setup_rising ;      ~630
    fall_constraint (constraint_table_template) {
      values("4.430,4.428,4.435,4.448,4.501", \
                                                608
```

FIG. 6A

```
pin(PD) {
    timing () {
        related_pin : "PS" ;
        timing_type : non_seq_setup_rising ;          ~630
        fall_constraint (constraint_table_template) {
            values("800.931,800.942,801.005,801.072,801.23")   684
        }                                                       ~686
    } timing () {
        related_pin : "PS" ;
        timing_type : non_seq_hold_falling;           ~628
        rise_constraint (constraint_table_template) {
            values("12.612,12.604,12.594,12.515,12.508")   678
        }            ~682
    } timing () {
        related_pin : "CSB" ;
        timing_type : non_seq_setup_falling ;         ~674
        fall_constraint (constraint_table_template) {            ~676
            values("800.924,800.937,801.004,801.07,801.22")   670
        }
    } timing () {
        related_pin : "CSB" ;
        timing_type : non_seq_hold_rising;            ~664
        rise_constraint (constraint_table_template) {
            values("12.609,12.606,12.589,12.573,12.542")   662
        }            ~666
    } timing () {
        when : "!PD*!PS*!CSB*PGENB*LOAD" ;
        sdf_cond : "check_read_start" ;               ~616
        related_pin : "STROBE" ;
        timing_type : non_seq_setup_rising ;          ~630
        fall_constraint (constraint_table_template) {            ~654
            values("805.353,805.378,805.478,805.548,805.697")
        }                                                         650
    }
}
```

For pin CSB
Max set-up time from the table: 4.501
Max hold time from the table: 4.070

For pin LOAD:
hold: 3.847
set-up: 4.060

For pin PGENB:
hold: 3.981
set-up: 3.953

For pin MR:
Set-up: 10.272
Hold: 9.771

For STROBE (read):
Constraint_high: 120.00134

For STROBE (program):
Constraint_high: 11000.00512

For PS:
Setup: 54.670, no hold against STROBE
Hold: 51.611 (with related pin CSB)

For PD:
Setup: 805.688, no hold against STROBE
Setup against CSB: 801.23
Hold against CSB: 12.612
Setup against PS: 801.22
Hold against PS: 12.612

For pin A0 (or most of the address pins)
Max set-up timing from the table: 11.910
Max hold time from the table: 11.473

FIG. 7

```
algorithm {
  name read {
```

| | | |
|---|---|---|
| // Get the set-up times against STROBE port for all the above ports present in read enable condition<br>// and sort them in decreasing order. | | 804 |
| assign PD 0 | // setup: 805.697 against STROBE and 801.22 against PS and CSB | |
| wait 81 | // 801.22 ns before PS pin setting, with 10 ns period we need 81 cycles (=810 ns) | |
| assign PS 0 | // setup: 54.670 against STROBE, we can find whether<br>// we need wait here based on next set of instructions<br>// 3 xmap instructions before actual read on STROBE<br>// every xmap entry is minimum 7 clock cycles<br>// one xmap instruction will take >70 ns based on 10ns clock period<br>// so no need for wait statement | |
| assign CSB 0 | // setup:4.501, every xmap entry is minimum 7 clock cycles<br>// so no need for wait statement | |
| assign LOAD 1 | // setup: 4.060 | |
| assign PGENB 1 | // setup: 3.953 | |

| | | |
|---|---|---|
| (-,-,12(r0),-,-) | // actual read at STROBE<br>// first 2 no-ops based on set-up time for address against<br>// STROBE pin (which is ~11 ns, hence 2 clock pulses)<br>// 120 ns 'constraint_high' on STROBE pin, hence 12 times read operation (12(r0))<br>// last 2 no-ops based on hold-up time for address against<br>// STROBE pin (which is ~11 ns, hence 2 clock pulses)<br>// The last no-ops must be equal to read_delay which varies based on some formula<br>// mentioned in the spec | 808 |

| | | |
|---|---|---|
| // now leave all signals (PD, PS, LOAD, CSB, PGENB) in safe state<br>// now take into account hold timings but with increasing order | | 812 |
| assign LOAD 1 | // hold: 3.647   already at '1' in this algorithm, we may leave this | |
| assign PGENB 1 | // hold: 3.953   already at '1' in this algorithm, we may leave this | |
| assign CSB 1 | // hold: 4.070 | |
| assign PS 0 | // hold: 51.611 against CSB   already at '0' in this algorithm, we may leave this | |
| assign PD 1 | // hold: 12.612 against CSB and PS. Every xmap instruction takes<br>// minimum 7 clock cycles.<br><br>// So, after CSB goes high (2 clock cycles = 20 ns) will cover the hold<br>// time requirements or do we add 'wait 2'. We do not need the wait<br>// statement here. The value changes at the end of the operation.<br>// CSB changes at time x, PD will change at x+7 cycles. | |

For pin CSB
Max set-up time from the table: 4.430
Max hold time from the table: 4.071

For pin LOAD:
hold: 3.852
set-up: 4.061

For pin PGENB:
hold: 3.983
set-up: 3.952

For pin MR:
Set-up: 10.278
Hold: 9.748

For STROBE:
Constraint_high: 11000.00512

For PS:
Setup: 54.693, no hold against STROBE
Hold: 51.612 (with related pin CSB)

For PD:
Setup: 855.887
Hold: 66.452 against STROBE
Setup against CSB: 801.25
Hold against CSB: 12.616
Setup against PS: 801.36
Hold against PS: 12.626

For pin A0 (or most of the address pins)
Max set-up timing from the table: 11.972
Max hold time from the table: 11.470

FIG. 9

```
algorithm {
  name pgm {
```
                                                                                                            ─ 1000

```
        // Get the set-up times against STROBE pin for all the above pins present in read enable condition  1004
        // and sort them in decreasing order.

assign PD 0      // setup: 855.878 against STROBE and 801.25 against PS and CSB
        wait 81          // 801.25 ns before PS pin setting, with 10 ns period we need 81 cycles (=810 ns)
        assign PS 1      // setup: 54.693 against STROBE, we can find whether
                         // we need wait here based on next set of instructions
                         // 3 xmap instructions before actual read on STROBE
                         // every xmap entry is minimum 7 clock cycles
                         // one xmap instruction will take >70 ns based on 10ns clock period
                         // so no need for wait statement
                         // setup: 51.609 against CSB, so add wait 6
                         // 51.609 ns before CSB pin setting, with 10 ns period we need 6 cycles
                         // No need of wait statement as >= 6 cycles are used to setup the xmap
                         // signal value.
        assign CSB 0     // setup: 4.430, every xmap entry is minimum 7 clock cycles
                         // so no need for wait statement.
    assign LOAD 0    // setup: 4.061
    assign PGENB 0   // setup: 3.952
```

```
        (-,-,1101(w-),-,-)   // actual write/program at STROBE                                              1008
                             // first 2 no-ops based on set-up time for address against
                             // STROBE pin (which is ~11 ns, hence 2 clock pulses)
                             // 11000.00512 ns 'constraint_high' on STROBE pin, hence 1101 times
                             // write operation (12(w-))
                             // last 2 no-ops based on hold-up time for address against
                             // STROBE pin (which is ~11 ns, hence 2 clock pulses)
                             // The last no-ops in program case is totally dependent upon
                             // setup/hold times and not the read_delay formula mentioned in the spec.
```

```
        // now leave all signals (PD, PS, LOAD, CSB, PGENB) in safe state                                   1012
        // now take into account hold timings but with increasing order
        assign LOAD 1    // hold: 3.852
        assign PGENB 1   // hold: 4.055
        assign CSB 1     // hold: 4.065, hold of 51.612 for PS, so need wait cycles here
    // need to wait for 51.612 before PS changes
                         // But no need of wait statement here as explained earlier
        assign PS 0      // hold: 51.612 against CSB
        assign PD 1      // hold: 66.452, hold: 12.616 against CSB and PS.
                         // Every xmap instruction takes minimum 7 clock cycles.
                         // 'assign LOAD 1' till 'assign PS0' will take care of this time requirements
  }
}
```

MEMORY VIEW FOR NON-VOLATILE MEMORY MODULE

CROSS-REFERENCE TO RELATED APPLICATION

This application is related to co-pending U.S. patent application Ser. No. 17/864,135, filed Jul. 13, 2022 entitled, "Control Algorithm Generator for Non-Volatile Memory Module", which is filed contemporaneously herewith and the entirety of which is herein incorporated by reference.

TECHNICAL FIELD

This disclosure relates to systems and methods for generating a memory view of a non-volatile memory (NVM) module such as one-time programmable (OTP) memory.

BACKGROUND

Static random-access memory (static RAM or SRAM) is a type of random-access memory (RAM) that uses bistable circuitry (e.g., a flip-flop) to store each bit. SRAM is volatile memory, such that data is lost when power is removed. The term 'static' differentiates SRAM from dynamic random-access memory DRAM which is periodically refreshed. SRAM is faster than DRAM, and SRAM is used for a cache and internal register files of a central processing unit (CPU) while DRAM is employed to implement a computer's main memory.

Read-only memory (ROM) is a type of non-volatile memory used in computers and other electronic devices. Data stored in ROM cannot be easily electronically modified after the manufacture of the memory device. ROM is useful for storing data that is rarely changed during the life of the system, also known as firmware. Software applications for programmable devices can be distributed as plug-in cartridges containing ROM.

In computing, a memory address is a reference to a specific memory location used at various levels by software and hardware. Memory addresses are fixed-length sequences of digits conventionally displayed and manipulated as unsigned integers. Such numerical semantic bases itself upon features of CPU (such as the instruction pointer and incremental address registers), as well upon use of the memory like an array endorsed by various programming languages.

Memory in a computing device has many memory locations. Each memory location has a physical address which is a code. The CPU (or other device) can use the code to access the corresponding memory location. Generally, only certain types of system software, such as the basic input output system (BIOS), operating systems, and some specialized utility programs (e.g., memory testers), address physical memory using machine code operands or processor registers, instructing the CPU to direct a hardware device, called the memory controller, to use the memory bus or system bus, or separate control, address and data busses, to execute the program's commands. The bus of a memory controller has a number of parallel lines, each represented by a binary digit (bit). The width of the bus, and thus the number of addressable storage units, and the number of bits in each unit, varies among computers and/or the type of memory being used.

A computer program uses memory addresses to execute machine code, and to store and retrieve data. In early computers logical and physical addresses corresponded, but since the introduction of virtual memory most application programs do not have a knowledge of physical addresses. Rather, they address logical addresses, or virtual addresses, using the computer's memory management unit and operating system memory mapping. In some examples, a portion of the memory is non-volatile memory (NVM). NVM is employable to implement the basic input output system (BIOS) of a computer or some portion thereof. In some examples, an NVM includes operations to implement a repair solution for other memory of a computing system.

SUMMARY

One example relates to a non-transitory machine-readable medium having machine-readable instructions. The machine-readable instructions include a memory view generator that evaluates a Liberty file characterizing an NVM module to generate a memory view file for the NVM module. The memory view file includes a port alias identifying ports of the NVM module, wherein the port alias for a set of ports of the NVM module characterizes a type of port in the set of ports. The memory view file also includes a port action identifying ports of the NVM module that have a static value during access to the NVM module and a port access identifying ports of the NVM module that have a dynamic value during access to the NVM module. The memory view file further includes an address limit characterizing a number of words in the NVM module and an address partition that characterizes address bits and data bits of the NVM module. Yet further, the memory view file includes a read delay that defines a number of clock cycles needed to hold an address bus stable after a strobe port transitions to an inactive state to enable proper reading of data from the NVM module.

Another example relates to a system having a non-transitory memory that stores machine-readable instructions. The system also includes a processing unit that accesses the memory and executes the machine-readable instructions. The machine-readable instructions include a memory view generator that evaluates a module design file characterizing an NVM module to generate a memory view file for the NVM module. The memory view file includes a port alias identifying ports of the NVM module. The port alias for a set of ports of the NVM module characterizes a type of port in the set of ports. The memory view file also has a port action identifying ports of the NVM module that have a static value during access to the NVM module. The memory view file also includes a port access identifying ports of the NVM module that have a dynamic value during access to the NVM module and an address limit characterizing a number of words in the NVM module. The memory view file further includes an address partition that characterizes address bits and data bits of the NVM module and a read delay that defines a number of clock cycles needed to hold an address bus stable after a strobe port transitions to an inactive state to enable proper reading of data from the NVM module.

Yet another example relates to a method for generating a memory view file of an NVM module. The method includes parsing, by a memory view generator operating on a computing platform, a Liberty file characterizing the NVM module to provide a port alias for a memory view file identifying ports of the NVM module, wherein the port alias for a set of ports of the NVM module characterizes a type of port in the set of ports. The method also includes determining, by the memory view generator a port action for the memory view file identifying ports of the NVM module that are assigned a static value based on the Liberty file. The method further includes determining, by the memory view generator, a port access for the memory view file identifying ports of the NVM module that have a dynamic value. The method yet further includes determining, by the memory view generator, an address limit of the memory view file characterizing a number of words in the NVM module. The method also includes determining, by the memory view generator, an address partition of the memory view file that characterizes address bits and data bits of the NVM module and setting, by the memory view generator a read delay of the memory view file that defines a number of clock cycles needed to hold an address bus stable after a strobe port transitions to an inactive state to enable proper reading of data from the NVM module.

BRIEF DESCRIPTION OF THE DRAWINGS

FIG. 2 illustrates a data structure in a Liberty file for an NVM module and a portion of a memory view file.

FIG. 3 illustrates another data structure in a Liberty file for an NVM module and a portion of a memory view file.

FIG. 4 illustrates still another data structure in a Liberty file for an NVM module and a portion of a memory view file.

FIG. 5 illustrates a portion of a memory view file.

FIG. 6A illustrates a first portion of a Liberty file for an NVM module.

FIG. 6B illustrates a second portion of the Liberty file for an NVM module.

FIG. 7 illustrates a table that characterizes an example of timing information extracted from a Liberty file and a memory view file by an NVM algorithm generator.

FIG. 8 illustrates a read algorithm for a control algorithm of an NVM module.

FIG. 9 illustrates another table that characterizes an example of timing information extracted from a Liberty file and a memory view file by an NVM algorithm generator.

FIG. 10 illustrates an example of a program algorithm generated by an NVM algorithm generator for an NVM module (e.g., the NVM module 104 of FIG. 1).

DETAILED DESCRIPTION

Figure 1:
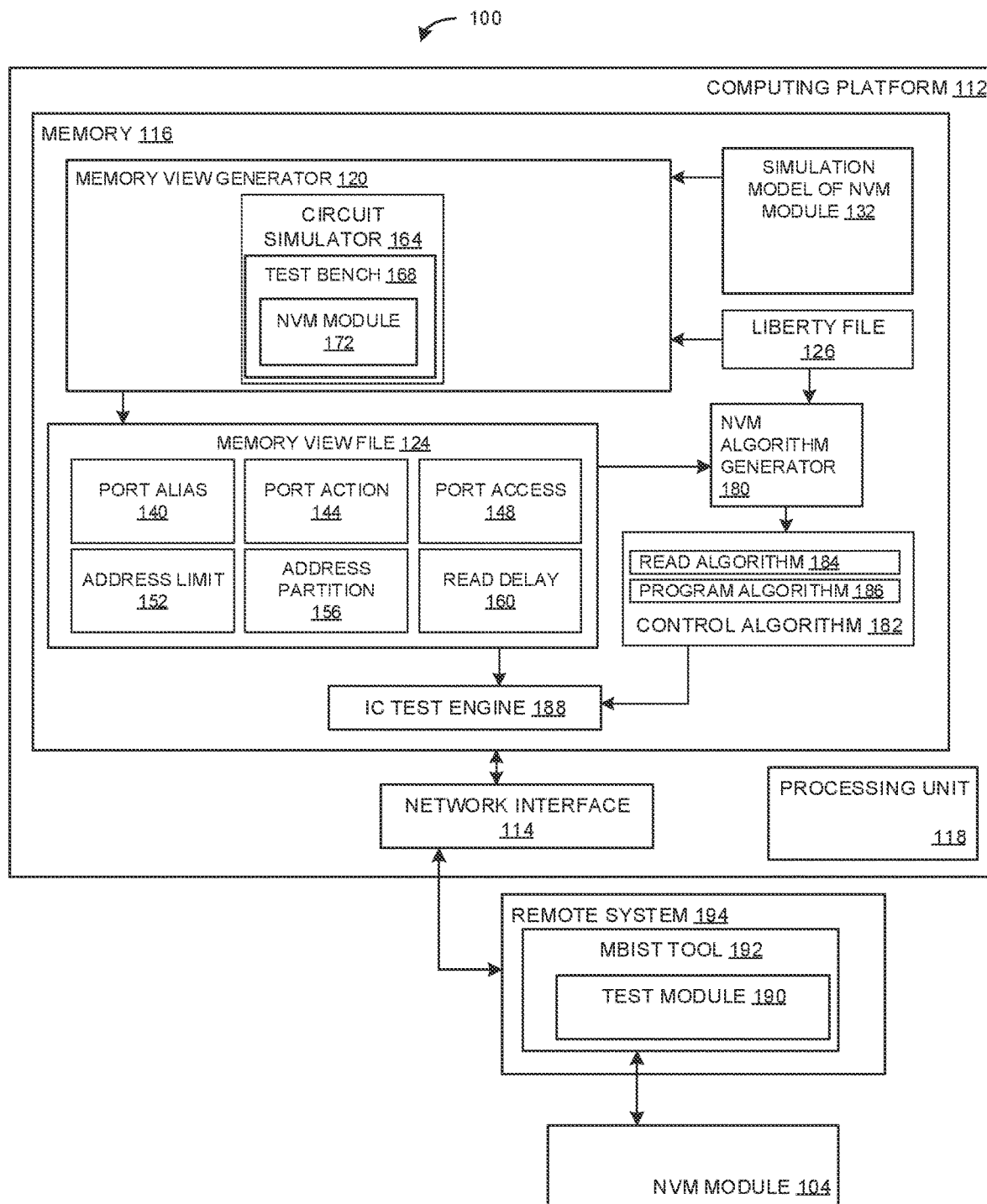
FIG. 1 illustrates an example of a system for generating a memory view file for an NVM module that can be implemented as a physically instantiated integrated circuit (IC) chip.

This disclosure relates to a memory view generator that evaluates a Liberty file characterizing an NVM module to generate a memory view file for the NVM module to enable repair operations. As used herein, the term "Liberty file" refers to an American Standard Code for Information Interchange (ASCII) file that contains characterization data for cells for an IC chip (e.g., the NVM module) in a standard way. More specifically, a Liberty file includes timing and power parameters for these cells. Liberty files are employable by synthesis tools and by place-and-route tools to design such IC chips. The memory view file includes a port alias identifying ports of the NVM module, wherein the port alias for the set of ports of the NVM module characterizes a type of each port in the NVM module. The memory view file also includes a port action identifying ports of the NVM module that are assigned a static value and a port access identifying ports of the NVM module that have a dynamic value. The memory view file has an address limit characterizing a number of words in the NVM module and an address partition that characterizes address bits and data bits of the NVM module. Further, the memory view file has a read delay that defines a number of clock cycles needed to hold an address bus stable after a strobe port transitions to an inactive state (e.g., logical 0) to enable proper reading of data from the NVM module.

The port alias of the memory view files identifies a strobe port of the NVM module. To identify the strobe port, the memory view generator identifies a read arc and a program arc of a plurality of program arcs defined in the Liberty file that has no related port to identify the strobe port. The strobe port has a read condition and a program condition. Activating the read condition causes a read arc of the strobe port to execute. Similarly, activation of the program condition causes a program arc (alternatively referred to as a write arc) of the strobe port to execute. The memory view generator is configured to identify ports in the port access of the memory view file and identifies active and/or inactive values for the ports. Additionally, a memory test tool assigns values to ports to assert a complement (opposite or safe value) of the program condition for the program arc to avoid inadvertent activation of the program arc. The port alias also identifies other ports of the NVM module based on information in the Liberty file, such as arrays of ports of the NVM module that provide a read bus, address bus and data-bit address.

Furthermore, in some examples, the memory view generator determines the address limit of the NVM based on the number of address ports and data-bit address ports. In other examples, the memory view generator analyzes simulation results of a simulated instance of the NVM module to determine the address limit. Further, the memory view generator can generate the address partition for the NVM module based on a number of address ports in the port alias. Further still, the memory view generator can determine the read delay based on an (i) active pulse width of the strobe port (included in the Liberty file), (ii) address hold timing with respect to the strobe port (also included in the Liberty file) and (iii) a fuse control clock period that corresponds to a clock at which the NVM module is accessed (which can be user defined).

In some examples, the memory view generator provides the memory view file to a NVM algorithm generator. The NVM algorithm generator analyzes the memory view file and the Liberty file to generate a control algorithm that includes a read algorithm and a program algorithm. The read algorithm includes an ordered set of operations to set values to ports of the NVM module to activate the read condition of the strobe port, execute a memory read from the NVM module, and then set the values to the ports to the complement of the program condition for the strobe port. These values (the complement) are referred to as safe values, and are assigned to ensure that unexpected and/or unwanted execution of an operation does not occur. Similarly, the program algorithm includes an ordered set of commands to set values to ports of the NVM module to activate the program condition of the strobe port, execute a memory write to the NVM module, and then set values to ports to assert the complement of the program condition for the strobe port. In other examples, the operations for the control algorithm can be generated manually by a user analyzing the memory view file and the Liberty file. Further, in some examples, the NVM algorithm generator can generate the control algorithm without the memory view file (e.g., by extracting data from the Liberty file).

A memory test tool receives the memory view file and the control algorithm for reading and writing data to the NVM module, and also for providing a repair solution to the NVM module. The memory test tool can insert hardware and software for a built-in memory self test (BIST) into a design for an IC chip, such as a memory IC chip (or an embedded memory). In such examples, the BIST that is inserted into the design for the IC chip can be employed to calculate a repair solution for memories present in the IC chip that is written to the NVM module based on the memory view file and the control algorithm. The memory test tool can be operating on a remote computing device, in some examples. In other examples, the memory test tool can operate on the same computing device as the memory view generator.

The system described can generate a memory view file and a control algorithm that is employable to insert hardware and software into a design for a physically instantiated NVM module. Moreover, the memory view generator generates the memory view file and the control algorithm from information about the NVM module. Stated differently, there is no requirement that the memory view generator be provided physical access to the NVM module.

FIG. 1 illustrates an example of a system 100 for generating a memory view file for an NVM module 104 that can be implemented as a physically instantiated IC chip. The system 100 can include a computing platform 112. Accordingly, the computing platform 112 can include a memory 116 for storing machine-readable instructions and data and a processing unit 118 for accessing the memory 116 and executing the machine-readable instructions. The memory 116 represents a non-transitory machine-readable memory (or other medium), such as RAM, a solid state drive, a hard disk drive or a combination thereof. The processing unit 118 can be implemented as one or more processor cores. The computing platform 112 can include a network interface 114 (e.g., a network interface card) configured to communicate with other computing platforms via a network, such as a public network (e.g., the Internet), a private network (e.g., a local area network (LAN)) or a combination thereof (e.g., a virtual private network).

The computing platform 112 could be implemented in a computing cloud. In such a situation, features of the computing platform 112, such as the processing unit 118, the network interface 114, and the memory 116 could be representative of a single instance of hardware or multiple instances of hardware with applications executing across the multiple of instances (i.e., distributed) of hardware (e.g., computers, routers, memory, processors, or a combination thereof). Alternatively, the computing platform 112 could be implemented on a single dedicated server or workstation.

In the examples described, the NVM module 104 represents a physically instantiated computer NVM module, such as OTP memory. The memory 116 includes a memory view generator 120. The memory view generator 120 is configured/programmed to generate a memory view file 124 that represents data sufficient to access the NVM module 104 (e.g., to read from and write to the NVM module 104). The memory view generator 120 employs a Liberty file 126 (or a module design file, more generally) and a simulation of the NVM module 132. In some examples, the Liberty file 126 and the simulation of the NVM module 132 are provided from a manufacturer (e.g., fabricator) of the NVM module 104, such as through a network.

In the examples provided, the Liberty file 126 is an ASCII file that stores timing and power parameters, and/or other characterization data associated with the NVM module 104 in a standardized format. However, other formats are alternatively employable. Such other formats may be proprietary or standardized. Thus, in general, a module design file is employable in place of the Liberty file 126, wherein such a module design file includes features similar to the Liberty file 126. Stated differently, the Liberty file 126 is considered to be one example implementation of a module design file. Thus, the module design file contains characterization data (including timing and power parameters) for cells for an IC chip (e.g., the NVM module 104) that may be stored in a standardized format or a proprietary format.

The memory view file 124 includes a set of data structures defining port operations and performance characteristics of the NVM module 104. The data structures of the memory view file 124 include a port alias 140, a port action 144, a port access 148, an address limit 152, an address partition 156 and a read delay 160. The terms, "port alias", "port action", "address partition" and "read delay" refer to one example set of terms. However, in other examples, other terms with similar (or the same) function are employable in place of the terms used herein.

The port alias 140 identifies ports (alternatively referred to as pins) of the NVM module 104 and a type associated with the ports. For example, the NVM module 104 includes a strobe port, an array of read bus ports, an array of address ports, an array of data-bit address ports, margin read ports, etc. The port action 144 identifies ports that have static values assigned thereto. The port access 148 identifies ports with dynamic values controllable with control signals that are employable to add hardware (e.g., logic). The address limit 152 defines a number of addresses (words) in the NVM module 104. The address partition 156 defines which bits of the NVM module 104 are assigned to an address bus and which bits of the NVM module 104 are assigned to a data write bus. Further, the read delay 160 defines a number of non-operations (no-ops) after a read operation on the NVM module 104 such that data is stable and can be properly read from the NVM module 104.

The memory view generator 120 can parse the Liberty file 126 of the NVM module 104 to generate the port alias. In particular, the memory view generator 120 parses the Liberty file 126 to identify the strobe port. FIG. 2 illustrates a data structure 200 in a Liberty file (e.g., the Liberty file 126 of FIG. 1) for an NVM module (e.g., the NVM module 104 of FIG. 1) that is parsed by a memory view generator (e.g., the memory view generator 120 of FIG. 1). The data structure 200 includes text describing operations of the strobe port (pin) of the NVM module.

The memory view generator parses the data structure 200 to identify arcs in the Liberty file. As used herein, the term "arc" (and its derivatives) refers to an impact that one edge of a signal has on another edge, which other edge can be on the same or on a different signal. The memory view generator is configured to identify arcs that have a keyword, "min_pulse_width( )" that defines a timing of a signal. In the present situation, there is a first instance 204 and a second instance 208 of the keyword, "min_pulse_width( )". Within each identified arc, the memory view generator identifies a standard delay format condition keyword, "sdf_cond" 212. A first instance of the keyword, "sdf_cond" 212 is nested under the first instance 204 of the keyword, "min_pulse_width( )" and has an argument of "check_read_start" 216 or other argument that includes "read" or "pgmb" embedded therein. It is noted that in other examples, the argument "pgmb" denotes the opposite of a program (write) operation, such that "pgmb" denotes the read operation. However, for purposes of simplification of explanation, the argument "check_read_start" is employed. The argument of check_read_start 216 (a read start command) indicates to the memory view generator that the arc nested in the first instance 204 of the keyword, "min_pulse_width( )" is a read arc 224.

A second instance of the keyword, "sdf_cond" 212 is nested under the second instance 208 of the "min_pulse_width( )" keyword and has an argument of "check_pgm_start" 220 or other keyword that includes "write" or "pgm" embedded therein. However, for purposes of simplification of explanation, the argument "check_pmg_start" is employed. The argument of the "check_pgm_start" 220 (a program start command) indicates to the memory view generator that the arc nested in the second instance 208 of the "min_pulse_width( )" keyword is program arc 228 (alternatively referred to as a write arc or programming arc).

Furthermore, both the read arc 224 and the program arc 228 have no related port. In particular, there is/are no "to_lib_pin" or "from_lib_pin" keywords in the read arc 224 or the program arc 228. Therefore, the memory view generator employs the argument of the keyword, "pin" 232 as the strobe port. In the present situation, the keyword, "pin" 232 has an argument of STROBE 236. Therefore, the memory view generator assigns the data structure 200 of the Liberty file to the strobe port.

FIG. 2 also includes a portion of a port alias data structure, port_alias 250 that is employable as a portion of the port alias 140 of FIG. 1. In response to identifying the strobe port from the Liberty file, the memory view generator writes the argument name (e.g., STROBE 236) for the identified strobe port into the port alias, port_alias 250 of the memory view file along with the associated keyword, "enable" 254. The employment of the keyword "enable" denotes one example. In other examples, a different keyword that elicits the same or a similar operation is employable.

The memory view generator is also configured to identify a read condition for the read arc 224 and a program condition of the program arc 228. The read condition and the program condition represent a Boolean expression. A condition of arcs (e.g., the read condition and the program condition) follow a keyword, "when" 260. That is, the read condition for the read arc 224 and the program arc 228 are the arguments for the keyword, "when" 260. Furthermore, the memory view generator identifies the program condition of the program arc 228 and determines a safe value for the program condition of the program arc 228. The safe value for the program arc 228 is the complement (opposite) of the program condition for the program arc 228. The program condition (the argument for the keyword, "when" in the program arc 228) is "!CSB*!PGENB*!LOAD*PS*!PD". Unless otherwise noted, the operator '*' indicates a logical AND Boolean operator and '!' indicates a NOT Boolean operator. Accordingly, the memory view generator determines that the complement of the program condition for the program arc 228 is "CSB*PGENB*LOAD*!PS*PD". FIG. 2 further includes a portion of a port access data structure, port_access 270. The memory view generator is configured to assign initial values to ports to activate the complement of the program condition for the program arc 228 to ensure that the program arc 228 is not activated inadvertently. Thus, in the port_access 270, values are assigned to set port PS to '0', PGENB to '1', PD to '1', LOAD to '1' and CSB to '1'.

Referring back to FIG. 1, using the technique described with respect to FIG. 2, the memory view generator 120 parses the Liberty file 126 to write information in the port alias 140 to identify the strobe port and to write information in the port access 148 to set initial values to ports to activate a safe condition for the NVM module 104 (e.g., the complement of the program condition for a program arc of the strobe port). Additionally, the memory view generator 120 parses the Liberty file 126 to determine parameters for the port alias 140 and the port action 144 for a read bus and for other ports.

FIG. 3 illustrates a data structure 300 in a Liberty file (e.g., the Liberty file 126 of FIG. 1) for an NVM module (e.g., the NVM module 104 of FIG. 1) that is parsed by a memory view generator (e.g., the memory view generator 120 of FIG. 1). The memory view generator parses the Liberty file and identifies ports that have the keyword, "direction" with an argument of "output" 304. In the present example, the data structure 300 shows two ports that have a direction of output 304, namely, port Q31 and port RF1, that are arguments of the keyword, "pin" 308.

For each such identified port (Q31 and RF1 in the present example), the memory view generator identifies an arc that includes the keyword, "related_pin" 312 with an argument of "STROBE", which indicates that the arc is based on operations of the strobe port. In the present example, the port Q31 includes a timing arc 316 and the port RF1 includes a timing arc 320.

Responsive to identifying the timing arc 316 of the port Q31, the memory view generator identifies the condition for the timing arc 316, which is an argument for the keyword, "when" 320. In the present example, the condition for the timing arc 316 of the port Q31 is "!PD*!PS!CSB*PGENB*LOAD". The memory view generator examines the condition for the timing arc 316 and compares this condition to the condition for the read arc 224 of the strobe port, as illustrated in FIG. 2. Because the condition for the timing arc 316 of the port Q31 matches (e.g., is the same as) the condition for the read arc 224 of the strobe port, the memory view generator marks the port Q31 as a read bus port, and records port Q31 as a read bus port in the port alias, port_alias 350 (continued from the port_alias 250 of FIG. 2).

The memory view generator identifies other ports, namely, ports Q30 . . . Q0 that have a direction of output, an arc (e.g., a timing arc) that are similarly related to the strobe port and have the same condition as the read arc 224 of the strobe port. These other ports are also recorded in port_alias 350 with a keyword, 'read_bus' 354 to provide an array of ports 358, namely, ports Q31 . . . Q0. The keyword "read_bus" is one example, in other examples, a different keyword that elicits the same or a similar operation is employable.

Further, in response to identifying the timing arc 320 of the port RF1, the memory view generator identifies the condition for the timing arc 320, which is an argument for the keyword, "when" 322. In the present example, the condition for the timing arc 320 of the port RF1 is "!PD*!PS!CSB*PGENB*LOAD*RWL*!RSB". The memory view generator examines the condition for the timing arc 320 and compares this condition to the read condition for the read arc 224 of the strobe port, as illustrated in FIG. 2. Because the condition for the timing arc 320 of the port RF does not match (e.g., are different) the read condition for the read arc 224 of the strobe port, the memory view generator marks the port RF1 as being a don't care port (e.g., a port where the value is immaterial), and records the port RF1 in a port action data structure, port_action 370, where the port RF1 is assigned a value of 'X' (a don't care value). Additionally, based on the results of the comparison of the condition for the timing arc 320, the memory view generator identifies extra ports in the condition for the timing arc 320 of the port RF that are not present in the condition for the read arc 224 of the strobe port, namely, ports RWL and RSB. To prevent the timing arc 320 from being activated inadvertently, these extra ports are added to the port_action 370 and assigned values equal to the complement of their active values in the condition for the timing arc 320 of the port RF1. Thus, port RWL is assigned a value of '0' and port RSB is assigned a value of '1'.

The memory view generator identifies other ports, namely, ports RF0, RF2 . . . RF7 that have a direction of output, an arc (e.g., a timing arc) that are similarly related to the strobe port and have a different condition as the read arc 224 of the strobe port. These other ports are also recorded in port_action 370 to as being assigned a don't care value of 'X'.

Referring back to FIG. 1, using the technique described with respect to FIG. 3, the memory view generator 120 parses the Liberty file 126 to write information in the port alias 140 to identify the read bus. Additionally, using these techniques, the memory view generator 120 writes information in the port access 148 to set initial values to ports to set other ports to be inactive. Moreover, the memory view generator 120 parses the Liberty file 126 to determine parameters for the port alias 140 and the port action 144 for an address bus, a data-bit address and for other ports.

FIG. 4 illustrates a data structure 400 in a Liberty file (e.g., the Liberty file 126 of FIG. 1) for an NVM module (e.g., the NVM module 104 of FIG. 1) that is parsed by a memory view generator (e.g., the memory view generator 120 of FIG. 1). The memory view generator parses the Liberty file and identifies ports that have the keyword, "direction" with an argument of "input" 404. In the present example, the data structure 400 shows two ports that have a direction of input 404, namely, port A12 and port A7, that are arguments of the keyword, "pin" 408. Moreover, the memory view generator discards ports that have already been identified, and the remaining ports are address ports, data-bit address ports or special ports, such as marginal read (MR) ports.

The memory view generator identifies ports that have both a read arc and a program arc. In the present example, port A7 includes both a read arc 412 and program arc 416 (alternatively referred to as a write arc) that are identifiable with arguments for the keyword, "sdf_cond". Additionally, the memory view generator identifies ports that have only a program arc (and no read arc). In the present example, port A12 includes a program arc 420 that is identifiable with arguments for the keyword, "sdf_cond".

Ports that have both a read arc and a program arc are recorded by the memory view generator as address port (pins) in a port alias, port_alias 450 (continued from the port_alias 350 of FIG. 3). More particularly, a keyword, "a" 454 identifies an array of ports 458, namely, ports A7 . . . A0 that are the address ports for the NVM module. Further, ports that have only a program arc (and no read arc) are recorded by the memory view generator as data-bit address ports in the port_alias 450. More particularly, a keyword, "dba" 462 identifies an array of ports 466 that are the data-bit bus address ports for the NVM module. In the example provided, the keywords "a" and "dba" are employed. In other examples, different keywords that elicit the same or similar operations are employable.

Furthermore, the memory view generator identifies the remaining (uncategorized) ports that are commonly referred to as special ports. The memory view generator adds these ports to a port action, port_action 470 (continued from the port_action 370 of FIG. 3). These ports include a marginal read port that has a port name of "MR" 474, and this port is added to the port_action 470 with an assigned value of 'X' (value of don't care).

Referring back to FIG. 1, using the technique described with respect to FIG. 4, the memory view generator 120 parses the Liberty file 126 to write information in the port alias 140 to identify the address bus, data-bit address and remaining ports of the NVM module 104. Additionally, using these techniques, the memory view generator 120 writes information in the port access 148 to set initial values to ports to set other ports to be inactive.

Figure 5:
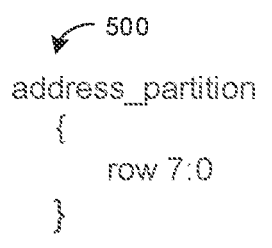

The memory view generator 120 determines the address limit 152 and the address partition 156 for the NVM module 104. To determine the address partition 156, the memory view generator 120 examines the port alias 140 and identifies an ordinal number of address ports in the port alias 140. FIG. 5 illustrates a data structure 500 with an address partition, address_partition that is employable to implement the address partition 156 of FIG. 1. More particularly, the data structure 500 includes a keyword, "row" and an argument that identifies a number of rows in an NVM module (e.g., the NVM module 104 of FIG. 1). In the data structure 500, the keyword "row" is followed by the argument "7:0" to indicate that there are 8 address ports (A7, A6, . . . , A0).

There are multiple techniques that the memory view generator 120 can use to generate the address limit 152 of the memory view file 124. In one technique, the memory view generator 120 counts a number of address ports in the port alias 140 and adds that number to a number of data-bit address ports in the port alias 140. In the example illustrated in FIG. 4, there are 8 address ports (ports A0 . . . A7) and there are 5 data-bit address ports (ports A8 . . . A12), such that the sum is 13. This number (13 in the present example) is an exponent of 2 (e.g., $2^{13}$) to define the address limit 152 for the NVM module 104.

In another technique the memory view generator 120 can cause a circuit simulator 164 to simulate the NVM module 104 for generation of the address limit 152. The circuit simulator 164 employs the simulation model of the NVM module 132, the port alias 140, the port action 144 and the port access 148 to create a testbench 168 around the NVM module 104 for use in a simulation analysis script and invoke the simulation analysis script to determine values for the address limit 152 of the memory view file 124. More particularly, the circuit simulator 164 executes a simulation of the NVM module 132 to create the testbench 168 over an NVM module 172 using the simulation model of the NVM module 132 and executes the simulation. The NVM module 172 represents an instantiation of the NVM module 104, and has functional signals, such as clock signals defined.

In some examples, to determine the address limit 152 the testbench 168 can write a value of '0' or '1' to every memory address of the NVM module 172 of one or more memory banks and read back the writing results. If some memory addresses return a value of 'X' (where 'X' is a stand in for an unknown value), those addresses are not a valid location. In such a situation, the testbench 168 can be configured to set the highest of these addresses (that returned a value which is not 'X') to the address limit 152 of the NVM module 104. In other examples, to determine the address limit 152 the testbench 168 can write a value of '0' or '1' to a last memory address in the NVM module 172 and read back the data on the last memory address. If the last memory address reads back the value written on the last memory address, the testbench 168 can set the address limit 152 to the last address. Conversely, if the last memory address reads back a value of 'X', the testbench 168 can select a new memory address that is before the last memory address and write a value of '0' or '1' to the selected memory address. The testbench 168 reads back the value written to the selected memory address. If the selected memory address is a value of 'X', the selected memory address is reduced again (e.g., by one), and the process is repeated (e.g., writing a value to the selected memory address and reading back the written value) until the selected memory address reads back the value written thereto, and this address is selected as the address limit 152.

The memory view generator 120 employs the Liberty file 126 to generate the read delay 160 for the memory view file 124. The read delay 160 defines a number of no-ops (no operations) following execution of a read operation (the strobe port goes inactive) on the NVM module 104, such that data is stable and the data can be read properly from the NVM module 104. The read delay 160 is a function of a fuse clock frequency, $T_{fcu}$, a read active pulse width of the strobe port, $T_{rd}$, an address hold time at a falling edge of the strobe port, $T_{hold}$ and a Q valid to strobe port falling edge, $T_{Q\text{-}to\text{-}strobe\text{-}falling}$. The pulse width of the strobe port, $T_{rd}$, the address hold time at the falling edge of the strobe port, $T_{hold}$ and the Q valid to strobe port falling edge, $T_{Q\text{-}to\text{-}strobe\text{-}falling}$ are extracted from the Liberty file 126, and the fuse clock frequency, $T_{fcu}$ can be defined (e.g., by a user).

The memory view file 124 and the Liberty file 126 can be provided to an NVM algorithm generator 180. The NVM algorithm generator 180 can generate algorithms that enable reading and writing data to the NVM module 104. More particularly, the Liberty file 126 includes data that can be utilized to determine the timing of signals of ports to actuate a read operation or a program operation on the NVM module 104.

The safe values for the program arc (e.g., the program arc 228 of FIG. 2) of the strobe port are defined in the port access 148 of the memory view file 124. In the example illustrated in FIG. 2, the program condition for the program arc 228 of the strobe port is "!CSB*!PGENB!LOAD*PS*!PD", such that the safe value for the program arc of the strobe port is PS=0, PGENB=1, PD=1, LOAD=1, CSB=1, as defined in the example of the port access, port_access 270 of FIG. 2.

Referring again to FIG. 2, an NVM algorithm generator (e.g., the NVM algorithm generator 180 of FIG. 1) parses the data structure 200 of the Liberty file (e.g., the Liberty file 126 of FIG. 1) and identifies the read condition in the read arc 224. The read condition is the argument for the keyword, "when" 260 in the read arc 224. In the illustrated example, the read condition for the read arc 224 of the strobe port is "!CSB*PGENGB*LOAD*!PS*!PD". Furthermore, the NVM algorithm generator extracts a high constraint of the strobe port, which is identifiable as an argument for the keyword, "constraint_high" 268, namely a value of "120.00134". Referring back to FIG. 1, in response to determining the read condition for the read arc of the strobe port, the NVM algorithm generator 180 determines a setup time against the strobe port for each port included in the read condition for the strobe port, namely ports CSB, PGENB, LOAD, PS and PD.

FIGS. 6A and 6B illustrate a data structure 600 in a Liberty file (e.g., the Liberty file 126 of FIG. 1) for an NVM module (e.g., the NVM module 104 of FIG. 1) that is parsed by an NVM algorithm generator (e.g., the NVM algorithm generator 180 of FIG. 1) to determine an algorithm for controlling read and program operations of the NVM module.

The NVM algorithm generator is configured to identify a read arc 604 and a read arc 608 for ports that are related to the strobe port (e.g., "STROBE" is the argument for the keyword, "related_pin"), of the port CSB of FIG. 6A. More particularly, the NVM algorithm generator identifies an argument for the keyword, "sdf_cond" 612. Moreover, the argument "check_read_start" 616 of the keyword, "sdf_cond" 612 identifies the read arc 604 for hold timing. Similarly, the argument, "check_read_start" 620 of the keyword, "sdf_cond" 612 identifies the read arc 608 for set-up timing.

Furthermore, the NVM algorithm generator identifies an argument for the keyword, "timing_type" 624 in the read arc 604. For the read arc 604, the argument for the keyword, "timing_type" 624 is "non_seq_hold_falling" 628, which indicates that the read arc 604 defines a hold time for the read arc 604. Moreover, the NVM algorithm generator identifies arguments (numerical value) for the keyword, "values" 632, and selects a greatest value, namely, "4.070" 636. Moreover, the NVM algorithm generator assigns a maximum hold time for the read arc 604 of the CSB port to the value of 4.070 nanoseconds (ns). In some examples, this time unit is specified in another section of the Liberty file.

In a similar manner, the NVM algorithm generator identifies an argument for the keyword, "timing_type" 624 in the read arc 608. For the read arc 608, the argument for the keyword, "timing_type" 624 is "non_seq_setup_rising" 630, which indicates that the read arc 608 defines a setup time for the read arc 608. Moreover, the NVM algorithm generator identifies arguments (numerical value) for the keyword, "values" 632, and selects a greatest value, namely, "4.501" 640. Moreover, the NVM algorithm generator assigns a maximum hold time for the read arc 608 of the CSB port to this value, namely 4.501 ns.

As illustrated in FIG. 6B, the data structure 600 also includes arcs for port PD. The NVM algorithm generator identifies a read arc 650 based on the argument "check_read_start"616 for the keyword, "sdf_cond" 612. Additionally, the read arc 650 of the port PD is related to the strobe port, as indicated by the keyword, "related_pin". Also, of the NVM algorithm generator identifies the argument of "non_seq_setup_rising" 630 for the keyword, "timing_type" 624 to indicate that the read arc 650 has a setup time, which is a greatest value of the argument "values" 632, namely "806.697" 654. The NVM algorithm generator records this value, namely 806.697 ns as the maximum setup time for the read arc 650 for the port PD.

Additionally, the port PD includes an arc 662 that has a related port of CSB as indicated by the keyword, "related_pin". Additionally, the NVM algorithm generator identifies an argument of "non_seq_hold_rising" 664 for the keyword, "timing_type" 624 and a greatest value for the keyword, "values" 632 of the arc 662 of the port PD, which is "12.609" 666 in the present example. Thus, the NVM algorithm generator assigns a maximum hold time after a rising edge of the port CSB to a value of 12.609 ns.

Further, the port PD includes another arc 670 that also has related port of CSB as indicated by the keyword, "related_pin". Additionally, the NVM algorithm generator identifies an argument of "non_seq_setup_falling" 674 for the keyword, "timing_type" 624 and a greatest value for the keyword, "values" of the arc 670 of the port PD, which is "801.22" 676 in the present example. Thus, the NVM algorithm generator assigns a maximum setup time after a falling edge of the port CSB to a value of 801.22 ns.

The port PD includes an arc 678 that has a related port of PS as indicated by the keyword, "related_pin". Additionally, the NVM algorithm generator identifies an argument of "non_seq_hold_falling" 628 for the keyword, "timing_type" 624 and a greatest value for the keyword, "values" of the arc 678 of the port PD, which is "12.612" 682 in the present example. Thus, the NVM algorithm generator assigns a maximum hold time after a falling edge of the port PS to a value of 12.612 ns.

The port PD includes another arc 684 that has a related port of PS as indicated by the keyword, "related_pin". Additionally, the NVM algorithm generator identifies an argument of "non_seq_setup_rising" 630 for the keyword, "timing_type" 624 and a greatest value for the keyword, "values" 632 of the arc 684 of the port PD, which is "801.23" 686 in the present example. Thus, the NVM algorithm generator assigns a maximum setup time after a rising edge of the port PS to a value of 801.23 ns.

Referring back to FIG. 1, the NVM algorithm generator 180 can employ the operations described in FIGS. 6A and 6B to parse the data in the Liberty file 126 for each port identified in the read condition for the read arc of the strobe port (e.g., the ports CSB, PGENB, LOAD, PS and PD in the example illustrated in FIG. 2). Additionally, the NVM algorithm generator 180 can extract similar information for other ports of the NVM module 104 as well. Also, the NVM algorithm generator 180 parses the port alias 140 of the memory view file 124 to determine operational parameters for the read algorithm 184 and the program algorithm 186 of the control algorithm 182.

FIG. 7 illustrates a table 700 that characterizes an example of timing information extracted from a Liberty file (e.g., the Liberty file 126 of FIG. 1) and a memory view file (e.g., the memory view file 124) by an NVM algorithm generator (e.g., the NVM algorithm generator 180). For purposes of simplification of explanation, the information characterizes portions of data included in FIGS. 2-5, 6A and 6B. The values illustrated in FIG. 7 are employable to generate a read algorithm for the NVM module.

Referring back to FIG. 1, responsive to extracting the timing information from the Liberty file 126 and the memory view file 124 (e.g., the information characterized by the table 700 of FIG. 7), the NVM algorithm generator 180 can generate the read algorithm 184 of the control algorithm 182 for the NVM module 104. The read algorithm 184 is configured to provide an order of operations that are based on the extracted timing information. Additionally, in some examples, the NVM algorithm generator 180 can be configured to generate the control algorithm 182 without the memory view file. Further, in some examples, a user can manually generate the control algorithm (e.g., by inspecting timing diagrams for the NVM module 104). Stated differently, the memory view generator 120 and the NVM algorithm generator 180 can operate independently in some examples. However, for purposes of simplification of explanation, it is presumed that the memory view generator 120 and the NVM algorithm generator 180 operate in concert.

FIG. 8 illustrates an example of a read algorithm 800 generated by an NVM algorithm generator (e.g., the NVM algorithm generator 180 of FIG. 1) for an NVM module (e.g., the NVM module 104 of FIG. 1). The read algorithm 800 includes commands in an order dictated by the timing information in the table 700 of FIG. 7. In other examples, alternative keywords that actuate similar functions are employable.

A first block of commands 804 assigns values to ports (pins) of the NVM module that have a setup time against the strobe port, including the ports, PD, PS, CSB, LOAD and PGENB. Moreover, the ports are assigned values to activate the read arc 224 of the strobe port illustrated in FIG. 2. That is, the first block of commands 804 cause the condition, !CSB*PGENB*LOAD*!PS*!PD. Moreover, the order of the assignment of commands within the first block of commands 804 is the order of the setup time against the strobe port, with the greatest maximum setup time against the strobe port (e.g., port PD, having a maximum setup time against the strobe port of 805.697 ns) being first, and a shortest setup time against the strobe port being last (e.g., port PGENB, having a setup time against the strobe port of 3.953 ns).

Further, the first block of commands 804 includes a wait command, "wait 81" that commands a waiting period of 81 clock cycles, which is selected based on the $T_{fcu}$. $T_{fcu}$ is the clock period at which the NVM module is being accessed. $T_{fcu}$ is provided by a user or another source, and is used in calculating the read delay of the memory view file. In the examples provided, $T_{fcu}$ is presumed to be 10 ns, but in other examples, $T_{fcu}$ can be shorter or longer. The wait command ensures that 810 ns will have elapsed between execution of commands to handle the setup time of 801.22 ns of the PD port against the PS port. Stated differently, the wait command prior to execution of a read command in a second command block 808 ensures that a sufficient interval of time has passed between assigning a value to a particular port (e.g., port PD in the illustrated example) in the set of ports and execution of the read command, and this interval of time is based on the setup time for the particular port.

The second command block 808 includes a read command at the strobe port, command "12(r0)". In the command "12(r0)", the term 'r0' denotes a read operation and the term '12' denotes how many clock cycles are needed to read from one address. The term '12' is based on the argument of the keyword "constraint_high" 268, namely a value of "120.00134" of the read arc 224 of FIG. 2. Because the clock period of $T_{fcu}$ is presumed to be 10 ns, the write operation needs about 12 clock cycles. Additionally, the command read command of the second command block 808 includes a first set of two no-op commands ("-,-" before "12(r0)") and a second set of two no-op commands ("-,-" after "12(r0)"). The number of no-op commands is dependent on the clock period of the $T_{fcu}$, which is 10 ns in the examples provided, as well as a set-up and hold time of the address bus against the strobe port. The second command block 808 is executable a plurality of times (e.g., in a loop) based on a number of read cycles for the read algorithm 800.

A third command block 812 assigns values to the ports of the NVM module to assert the safe condition for the strobe port, namely the complement of the program condition for the program arc 228 of the strobe port illustrated in FIG. 2 (e.g., the complement of "!CSB*!PGENB*!LOAD*PS*!PD"). The third command block 812 assigns values to the ports in an order from a shortest hold time against the strobe port to a longest hold time against the strobe port. Additionally, some ports have a hold time against multiple ports. For instance the PD port has a hold time against both the strobe port and the PS port. Therefore, the PD port has an assignment after the assignment of the PS port, independent of the hold time between the PD port and the strobe port. Accordingly, execution of the read algorithm 800 (*i*) enables a read condition for the read arc of the strobe port, (ii) executes a read operation and (iii) sets values to ports to the complement of the program arc of the strobe port. In the read algorithm 800, certain keywords, such as "xmap" are employed. As used herein, the term "xmap" indicates all assign and wait statements. In the example illustrated, execution of an "xmap" takes at least 7 clock cycles. In other examples, an alternative key word that elicits the same or similar operation is employable. In such situations, these other examples may take a different number of clock cycles and the timing information may change.

Referring again to FIG. 2, an NVM algorithm generator (e.g., the NVM algorithm generator 180 of FIG. 1) parses the data structure 200 of the Liberty file (e.g., the Liberty file 126 of FIG. 1) and identifies the program condition in the program arc 228. The program condition is the argument for the keyword, "when" 260 in the program arc 228. In the illustrated example, the program condition for the program arc 228 of the strobe port is "!CSB*!PGENGB*!LOAD*PS*!PD". Furthermore, the NVM algorithm generator extracts a high constraint of program arc 228 of the strobe port, which is the identifiable as an argument for the keyword, "constraint_high" 268, namely a value of "11000.00512". Referring back to FIG. 1, in response to determining the program condition for the program arc of the strobe port, the NVM algorithm generator 180 determines a setup time against the strobe port for each port included in the program condition for the strobe port, namely ports CSB, PGENB, LOAD, PS and PD.

Referring back to FIG. 1, responsive to extracting the timing information from the Liberty file 126 and the memory view file 124 (e.g., the information characterized by the table 700 of FIG. 7), the NVM algorithm generator 180 can generate the program algorithm 186 of the control algorithm 182 for the NVM module 104. The program algorithm 186 is configured to provide an order of operations that are based on the extracted timing information.

FIG. 9 illustrates a table 900 that characterizes an example of timing information extracted from a Liberty file (e.g., the Liberty file 126 of FIG. 1) and a memory view file (e.g., the memory view file 124) by an NVM algorithm generator (e.g., the NVM algorithm generator 180). The table 900 is similar to the table 700 of FIG. 7, with values extracted for a program arc (e.g., the program arc 228 of FIG. 2). The values illustrated in FIG. 9 are employable to generate a program algorithm for the NVM module.

FIG. 10 illustrates an example of a program algorithm 1000 generated by an NVM algorithm generator (e.g., the NVM algorithm generator 180 of FIG. 1) for a NVM module (e.g., the NVM module 104 of FIG. 1). The program algorithm 1000 includes commands in an order dictated by the timing information in the table 900 of FIG. 9.

A first block of commands 1004 assigns values to ports (pins) of the NVM module that have a setup time against the strobe port, including the ports, PD, PS, CSB, LOAD and PGENB. Moreover, the ports are assigned values to activate the program arc 228 of the strobe port illustrated in FIG. 2. That is, the first block of commands 804 cause the condition, !CSB*!PGENB*!LOAD*PS*!PD. Moreover, the order of the assignment of commands within the first block of commands 1004 is an order of the setup time against the strobe port, with the greatest maximum setup time against the strobe port (e.g., port PD, having a maximum setup time against the strobe port of 855.887 ns) being first, and a shortest setup time against the strobe port being last (e.g., port PGENB, having a setup time against the strobe port of 3.952 ns).

Further, the first block of commands 1004 includes a wait command, "wait 81" that commands a waiting period of 81 clock cycles, which is selected based on the $T_{fcu}$ (10 ns in the examples provided). The wait command ensures that 810 ns will have elapsed to handle the setup time of 801.25 ns of the PD port against the PS port. Execution of the wait command ensures that a sufficient interval of time has passed between assigning a value to a given port (namely, the port PD in the illustrated example) and execution of a command in a second command block 1008. In this situation, the interval of time is based on the setup time for the given port.

The second command block 1008 includes a write command at the strobe port, command "1101(w-)". As used herein, the keyword 'w-' denotes a write operation, and the value '1101' defines the number of cycles needed to write to one address. This value is based on the argument the keyword, "constraint_high" 268 of the program arc 228, namely a value of 11000.00512. Because the clock period of $T_{fcu}$ is presumed to be 10 ns, the write operation needs about 1101 clock cycles. Additionally, the read command of the second command block 1008 includes a first set of two no-op commands ("-,-" before "1101(w-)") and a second set of two no-op commands ("-,-" after "1101(w-)"). The second command block 1008 is executable a plurality of times (e.g., in a loop) based on a number of program cycles for the program algorithm 1000. The number of no-op commands is dependent on the clock period of the $T_{fcu}$, which is 10 ns in the examples provided, as well as a set-up and hold time of the address bus against the strobe port.

A third command block 1012 assigns values to the ports of the NVM module to assert the safe condition for the strobe port, namely the complement of the program condition for the program arc 228 of the strobe port illustrated in FIG. 2 (e.g., the complement of "!CSB*!PGENB*!LOAD*PS*!PD"). The third command block 1012 assigns values to the ports in an order from a shortest hold time against the strobe port to a longest hold time against the strobe port. Additionally, some ports have a hold time against multiple ports. For instance, the PD port has a hold time against both the CSB port and the PS port. Therefore, the PD port has an assignment after the assignment of the PS port, independent of the hold time between the PD port and the strobe port. Accordingly, execution of the program algorithm 1000 (i) enables a program condition for the program arc of the strobe port, (ii) executes a program operation and (iii) sets values to ports to the complement of the program arc of the strobe port.

The memory 116 can include an IC chip test engine 188 that receives the memory view file 124 and the control algorithm 182. The IC chip test engine 188 can collate the memory view file 124 and the control algorithm 182 to generate a test module 190 that is provided to a memory test tool 192 operating on a remote system 194. In some examples, the IC chip test engine 188, the test module 190 and the memory test tool 192 are operating on a common computing platform.

The test module 190 can include the memory view file 124 and the control algorithm embedded therein. The memory test tool 192 can insert hardware and software for a built-in memory self test (BIST) into a design for an IC chip. The BIST inserted into the user design of an IC chip (e.g., a memory) can calculate a repair solution for the memories present on an IC chip that is written to the NVM module 104. More specifically, an operator of the memory test tool 192 can employ the program algorithm 186 to program the NVM module 104 and can employ the read algorithm 184 to read the NVM module 104 that may be employable to test and repair other memories. More specifically, an operator of the memory test tool 192 can employ the read algorithm 184 and the program algorithm 186 to program the NVM module 104 and read the NVM module 104 that may be employable to test and repair other memories. Such operations can include executing read and program (write) operations to control fuses within the NVM module 104. Additionally, the memory test tool 192 can apply the test patterns to the NVM module 104 (a physical instantiation) to ensure that the NVM module 104 is operating properly. In particular, the memory test tool 192 can employ the procedures characterized in the control algorithm 182 (embedded in the test module 190) to read and program data to and from the NVM module 104.

By employment of the computing platform 112, the memory view file 124 and the control algorithm 182 are generated from information that is distributed from the designer of the NVM module 104. Additionally, generation of the memory view file 124 does not require any physical interaction with the NVM module 104. Thus, there is no requirement that the operator of the computing platform 112 ever receive a physical instantiation of the NVM module 104 to generate the memory view file 124 or the control algorithm. Instead, the memory view file 124 can be generated by the memory view generator 120 based on the Liberty file 126 and the simulation model of the NVM module 132. Moreover, the memory view file 124 can be distributed for testing instances of the NVM module 104.

Figure 11:
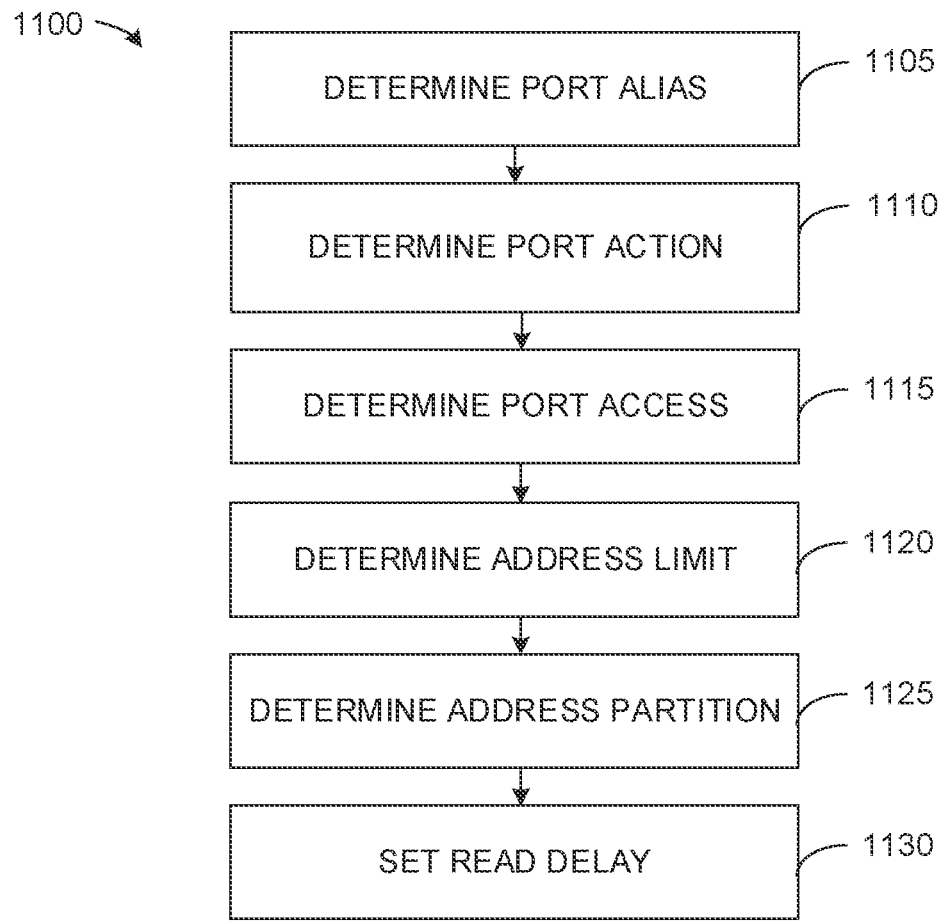
FIG. 11 illustrates a flowchart of an example method for generating a memory view of an NVM module.
Figure 12:
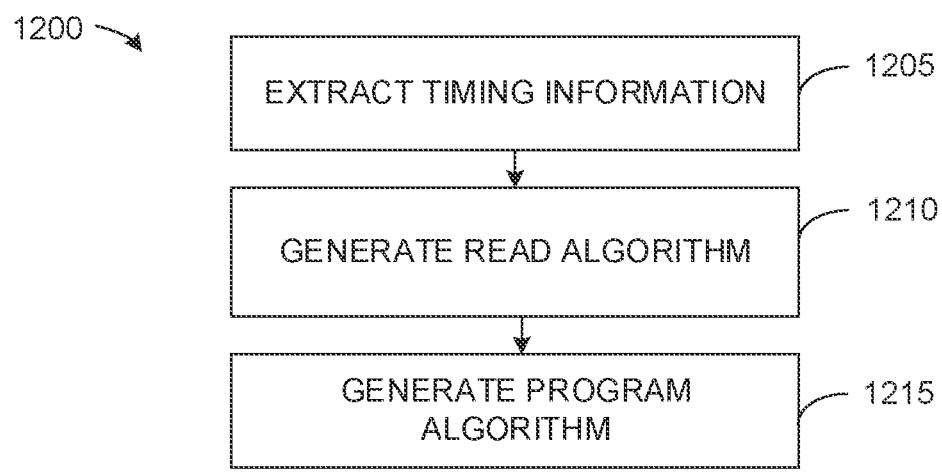
FIG. 12 illustrates a flowchart of an example method for generating a control algorithm for an NVM module.

In view of the foregoing structural and functional features described above, example methods will be better appreciated with reference to FIGS. 11 and 12. While, for purposes of simplicity of explanation, the example method of FIGS. 11 and 12 are shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 11 illustrates a flowchart of an example method 1100 for generating a memory view file. The method 1100 can be executed, for example, by a memory view generator (e.g., the memory view generator 120 of FIG. 1) operating on a computing platform (e.g., the computing platform 112 of FIG. 1). At 1105, the memory view generator determines a port alias for the memory view file identifying ports of the NVM module base on a parsing of a Liberty file characterizing a non-volatile memory (NVM) module that controls repair operations. The port alias for the set of ports of the NVM module characterizes a type of port in the set of ports. At 1110, the memory view generator determines a port action for the memory view file identifying ports of the NVM module that are assigned a static value based on the Liberty file. At 1115, the memory view generator identifies port access identifying ports of the NVM module that have a dynamic value. At 1120, the memory view generator determines an address limit of the memory view file characterizing a number of words in the NVM module. At 1125, the memory view generator determines an address partition for the NVM module that characterizes address bits and data bits of the NVM module. At 1130, the memory view generator sets a read relay of the memory view file that defines a number of non-operations (non-ops) for a read operation on the NVM module.

FIG. 12 illustrates a flowchart of an example method 1200 for generating a control algorithm for an NVM module (e.g., the NVM module 104 of FIG. 1). The method 1200 can be executed, for example, by an NVM algorithm generator (e.g., the NVM algorithm generator 180 of FIG. 1) operating on a computing platform (e.g., the computing platform 112 of FIG. 1). At 1205, the NVM algorithm generator parses a Liberty file (or a module design file, more generally) characterizing a NVM module that controls repair operations to extract timing information from the Liberty file that includes a set-up and hold time for ports related to a strobe port of the NVM module. At 1210, the NVM algorithm generator generates a read algorithm for the control algorithm that includes an order of operations for assigning values to ports of the NVM module to assert a read condition for the strobe port of the NVM module, executing a memory read on the NVM module and setting values to the ports on the NVM module to assert a complement of a program condition of the strobe port on the NVM module. The read algorithm assigns values to a set of ports in the NVM module to assert the read condition of the read arc in an order from a longest setup time to a shortest setup time and the read algorithm assign values to the set of ports in the NVM module to assert the complement of the program condition in the program arc in an order from a shortest hold time to a longest hold time.

At 1215, the NVM algorithm generator generates a program algorithm for the control algorithm that includes an order of operations for assigning values to ports of the NVM module to assert the program condition for the strobe port of the NVM module, executing a memory write on the NVM module and setting values to the ports on the NVM module to assert the complement of the program condition of the strobe port on the NVM module. The program algorithm assigns values to ports in the NVM module to assert the program condition of the program arc for the strobe port in an order from a longest setup time to a shortest setup time and the program algorithm assign values to the set of ports in the NVM module to assert the complement of the program condition in the program arc in an order from a shortest hold time to a longest hold time.

Figure 13:
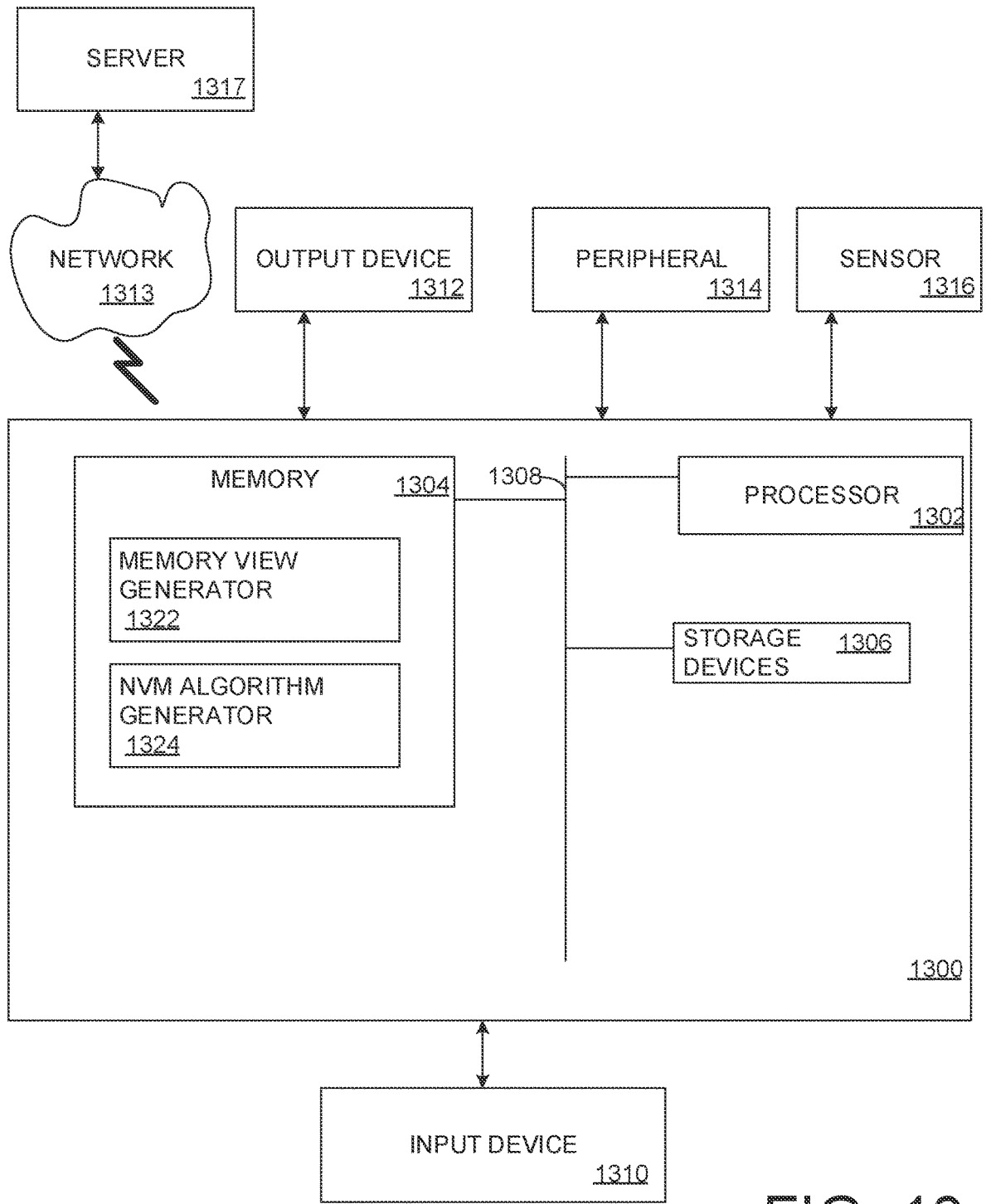
FIG. 13 illustrates an example of a computing system employable to generate a memory view file and a control algorithm.

The examples herein may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory and input and output device(s) to perform one or more embodiments. As shown in FIG. 13, the computing system 1300 can include a computer processor 1302, associated memory 1304 (e.g., RAM), cache memory, flash memory, etc., one or more storage devices 1306 (e.g., a solid state drive, a hard disk drive, an optical drive such as a compact disk (CD) drive or digital versatile disk (DVD) drive, a flash memory stick, etc.) and numerous other elements and functionalities. The computer processor 1302 may be an IC chip for processing instructions. For example, the computer processor may be one or more cores, or micro-cores of a processor. Components of the computing system 1300 can communicate over a data-bit 1308.

The computing system 1300 may also include an input device 1310, such as any combination of one or more of a touchscreen, keyboard, mouse, microphone, touchpad, electronic pen, or any other input device. Further, the computing system 1300 can include an output device 1312, such as one or more of a screen (e.g., light emitting diode (LED) display, an organic light emitting diode (OLED) display, a liquid crystal display (LCD), a plasma display, touchscreen, cathode ray tube (CRT) monitor, projector, or other display device), a printer, external storage, or any other output device. In some examples, such as a touch screen, the output device 1312 can be the same physical device as the input device 1310. In other examples, the output device 1312 and the input device 1310 can be implemented as separate physical devices. The computing system 1300 can be connected to a network 1313 (e.g., LAN, a wide area network (WAN) such as the Internet, a mobile network, or any other type of network) via a network interface connection (not shown). The input device 1310 and output device(s) 1312 can be connected locally and/or remotely (e.g., via the network 1313) to the computer processor 1302, the memory 1304 and/or the storage devices 1306. Many different types of computing systems exist, and the aforementioned input device 1310 and the output device 1312 can take other forms. The computing system 1300 can further include a peripheral 1314 and a sensor 1316 for interacting with the environment of the computing system 1300 in a manner described herein.

Software instructions in the form of computer readable program code to perform embodiments disclosed herein can be stored, in whole or in part, temporarily or permanently, on a non-transitory computer readable medium such as a CD, DVD, storage device, a diskette, a tape, flash memory, physical memory, or any other computer readable storage medium. Specifically, the software instructions can correspond to computer readable program code that when executed by a processor, is configured to perform operations disclosed herein. The computing system 1300 can communicate with a server 1317 via the network 1313.

The memory 1304 can include a memory view generator 1322 to generate a memory view file for an NVM module. Additionally, the memory 1304 includes an NVM algorithm generator 1324 to generate a control algorithm for the NVM module. Further, one or more elements of the aforementioned computing system 1300 can be located at a remote location and connected to the other elements over a network 1313. Additionally, some examples can be implemented on a distributed system having a plurality of nodes, where each portion of an embodiment can be located on a different node within the distributed system. In one example, the node corresponds to a distinct computing device. Alternatively, the node can correspond to a computer processor with associated physical memory. The node can alternatively correspond to a computer processor or micro-core of a computer processor with shared memory and/or resources.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on". Additionally, where the disclosure or claims recite "a," "an," "a first," or "another" element, or the equivalent thereof, it should be interpreted to include one or more than one such element, neither requiring nor excluding two or more such elements.

What is claimed is:

1. A non-transitory machine-readable medium having machine-readable instructions, the machine-readable instructions comprising:
    a memory view generator that evaluates a Liberty file characterizing a non-volatile memory (NVM) module to generate a memory view file for the NVM module the memory view file comprising:
        a port alias identifying ports of the NVM module, wherein the port alias for a set of ports of the NVM module characterizes a type of port in the set of ports;
        a port action identifying ports of the NVM module have a static value during access to the NVM module;
        a port access identifying ports of the NVM module that have a dynamic value during access to the NVM module;
        an address limit characterizing a number of words in the NVM module;
        an address partition that characterizes address bits and data bits of the NVM module; and
        a read delay that defines a number of clock cycles needed to hold an address bus stable after a strobe port transitions to an inactive state to enable proper reading of data from the NVM module.

2. The medium of claim 1, wherein the port alias identifies a strobe port of the NVM module.

3. The medium of claim 2, wherein the memory view generator identifies a read arc and a program arc of a plurality of arcs defined in the Liberty file that has no related port to identify the strobe port.

4. The medium of claim 3, wherein the strobe port includes a read condition and a program condition for the strobe port.

5. The medium of claim 4, wherein the port access assigns values to assert a complement of the program condition of the strobe port.

6. The medium of claim 5, wherein the port alias further identifies a read bus on the NVM module.

7. The medium of claim 6, wherein the read bus comprises an array of ports of the NVM module that have a read arc of a plurality of arcs defined in the Liberty file that are related to the strobe port and have read condition that matches the read condition of the strobe port.

8. The medium of claim 7, wherein a given port of the NVM module in the port action has an output direction and a read condition defined in the Liberty file that is different than the read condition of the strobe port.

9. The medium of claim 8, wherein the port action assigns values to assert the complement of the read condition of the given port.

10. The medium of claim 8, wherein the port alias further comprises:
    address ports comprising an array of ports of the NVM module that have an input direction, a read arc and a program arc defined in the Liberty file; and
    data-bit address ports comprising an array of ports of the NVM module that have an input direction and a program arc defined in the Liberty file.

11. The medium of claim 10, wherein the port action identifies a set of ports as marginal read ports that have an input direction that are not address ports or data-bit address ports.

12. The medium of claim 10, wherein the memory view generator determines the address limit of the NVM module based on a number of address ports and data address ports.

13. The medium of claim 10, wherein the memory view generator analyzes simulation results of a simulated instance of the NVM module to determine the address limit.

14. The medium of claim 10, wherein the memory generator generates the address partition for the NVM module based on a number of address ports in the port alias.

15. The medium of claim 1, wherein the read delay of the NVM module is based on an active pulse width of the strobe port, an address hold time for a falling edge of the strobe port, a Q valid to strobe port falling edge and a fuse control clock.

16. A system comprising:
a non-transitory memory that stores machine-readable instructions; and
a processing unit that accesses the memory and executes the machine-readable instructions, the machine-readable instructions comprising:
  a memory view generator that evaluates a module design file characterizing a non-volatile memory (NVM) module to generate a memory view file for the NVM module, the memory view file comprising:
    a port alias identifying ports of the NVM module, wherein the port alias for a set of ports of the NVM module characterizes a type of port in the set of ports;
    a port action identifying ports of the NVM module that have a static value during access to the NVM module;
    a port access identifying ports of the NVM module that have a dynamic value during access to the NVM module;
    an address limit characterizing a number of words in the NVM module;
    an address partition that characterizes address bits and data bits of the NVM module; and
    a read delay that defines a number of clock cycles needed to hold an address bus stable after a strobe port transitions to an inactive state to enable proper reading of data from the NVM module.

17. The system of claim 16, wherein the memory view generator identifies a read arc and a program arc of a plurality of program arcs defined in the Liberty file that has no related port to identify a strobe port of the NVM module, the strobe port includes a read condition and a program condition for the strobe port and the port access assigns values to assert a complement of the program condition of the strobe port.

18. The system of claim 16, wherein the module design file is a Liberty file.

19. A method for generating a memory view file of a non-volatile memory (NVM) module, the method comprising:
  parsing, by a memory view generator operating on a computing platform, a Liberty file characterizing the NVM module to provide a port alias for a memory view file identifying ports of the NVM module, wherein the port alias for a set of ports of the NVM module characterizes a type of port in the set of ports;
  determining, by the memory view generator a port action for the memory view file identifying ports of the NVM module that are assigned a static value based on the Liberty file;
  determining, by the memory view generator, a port access for the memory view file identifying ports of the NVM module that have a dynamic value;
  determining, by the memory view generator, an address limit of the memory view file characterizing a number of words in the NVM module;
  determining, by the memory view generator, an address partition of the memory view file that characterizes address bits and data bits of the NVM module; and
  setting, by the memory view generator a read delay of the NVM module that defines a number of clock cycles needed to hold an address bus stable after a strobe port transitions to an inactive state to enable proper reading of data from the NVM module.

20. The method of claim 19, wherein the parsing comprises identifying a read arc and a program arc of a plurality of program arcs defined in the Liberty file that have no related port to identify a strobe port of the NVM module, wherein the strobe port includes a read condition and a program condition for the strobe port.

* * * * *